US008821644B2

(12) United States Patent
Sakuragi et al.

(10) Patent No.: US 8,821,644 B2
(45) Date of Patent: Sep. 2, 2014

(54) BEVEL/BACKSIDE POLYMER REMOVING METHOD AND DEVICE, SUBSTRATE PROCESSING APPARATUS AND STORAGE MEDIUM

(75) Inventors: Isamu Sakuragi, Nirasaki (JP); Akinori Kitamura, Nirasaki (JP); Tsutomu Hiroki, Nirasaki (JP); Takehiro Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 773 days.

(21) Appl. No.: 12/268,649

(22) Filed: Nov. 11, 2008

(65) Prior Publication Data

US 2009/0143894 A1 Jun. 4, 2009

Related U.S. Application Data

(60) Provisional application No. 61/024,380, filed on Jan. 29, 2008.

(30) Foreign Application Priority Data

Nov. 13, 2007 (JP) ................................. 2007-294529

(51) Int. Cl.
*B08B 1/00* (2006.01)
*B24B 37/34* (2012.01)
*H01L 21/02* (2006.01)
*H01L 21/67* (2006.01)

(52) U.S. Cl.
CPC ........ *H01L 21/02087* (2013.01); *B24B 37/345* (2013.01); *H01L 21/0209* (2013.01); *H01L 21/67046* (2013.01); *H01L 21/67115* (2013.01); *H01L 21/67069* (2013.01); *H01L 21/67207* (2013.01); *Y10S 134/902* (2013.01)
USPC ................... 134/6; 134/1.3; 134/19; 134/902

(58) Field of Classification Search
USPC .................. 134/6, 902, 1.2, 1.3, 19
See application file for complete search history.

(56) References Cited

U.S. PATENT DOCUMENTS

| | | | | |
|---|---|---|---|---|
| 5,937,469 A | * | 8/1999 | Culkins et al. | 15/77 |
| 6,167,583 B1 | * | 1/2001 | Miyashita et al. | 15/77 |
| 6,261,377 B1 | * | 7/2001 | Mertens et al. | 134/6 |
| 2001/0035200 A1 | * | 11/2001 | Ishihara et al. | 134/33 |
| 2002/0108634 A1 | * | 8/2002 | McMullen | 134/6 |
| 2004/0248379 A1 | | 12/2004 | Maleville et al. | |
| 2006/0090774 A1 | * | 5/2006 | Sugarman et al. | 134/6 |
| 2006/0131268 A1 | * | 6/2006 | Mikhaylichenko et al. | 216/62 |

FOREIGN PATENT DOCUMENTS

| | | | |
|---|---|---|---|
| JP | 61144830 A | * | 7/1986 |
| JP | 2001-332606 | | 11/2001 |
| JP | 2005-142524 | | 6/2005 |
| JP | 2006-32653 | | 2/2006 |

OTHER PUBLICATIONS

Abstract of JP61-144830.*

* cited by examiner

*Primary Examiner* — Michael Kornakov
*Assistant Examiner* — Douglas Lee
(74) *Attorney, Agent, or Firm* — Rothwell, Figg, Ernst & Manbeck, P.C.

(57) ABSTRACT

A bevel/backside polymer removing method removes multi-layered bevel/backside polymers adhering to a bevel surface and a backside of a target substrate. The multi-layered bevel/backside polymers include an inorganic layer and an organic layer. The bevel/backside polymer removing method includes mechanically destroying the multi-layered bevel/backside polymers and heating residues of the multi-layered bevel/backside polymers mechanically destroyed.

7 Claims, 18 Drawing Sheets

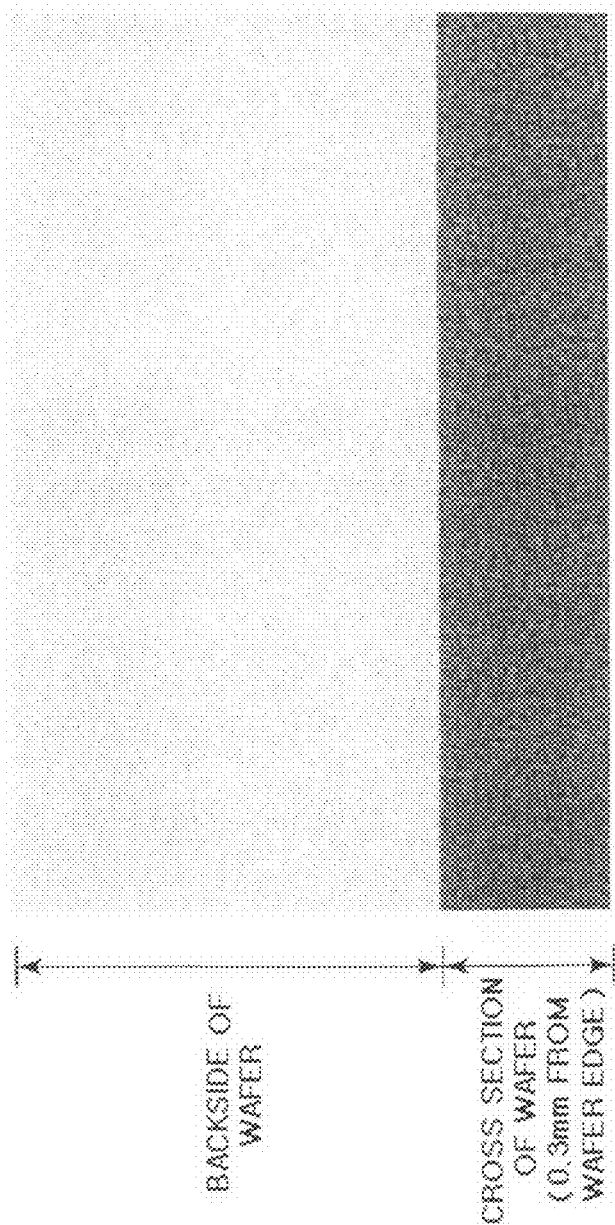

FIG.17A
(PRIOR ART)
FIG.17B
(PRIOR ART)
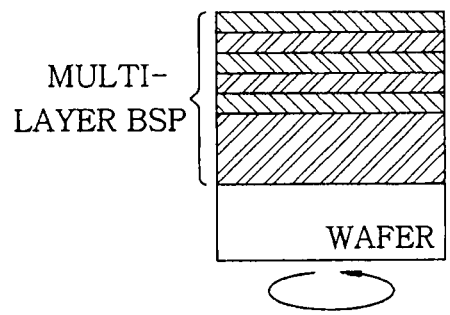
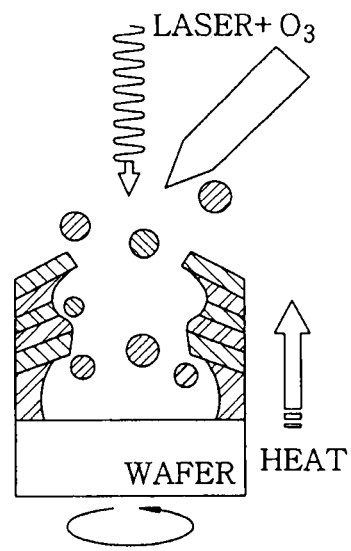
FIG.17C
(PRIOR ART)
FIG.17D
(PRIOR ART)
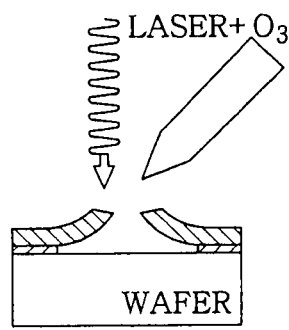
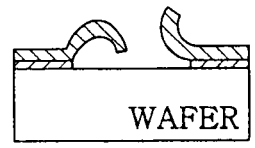

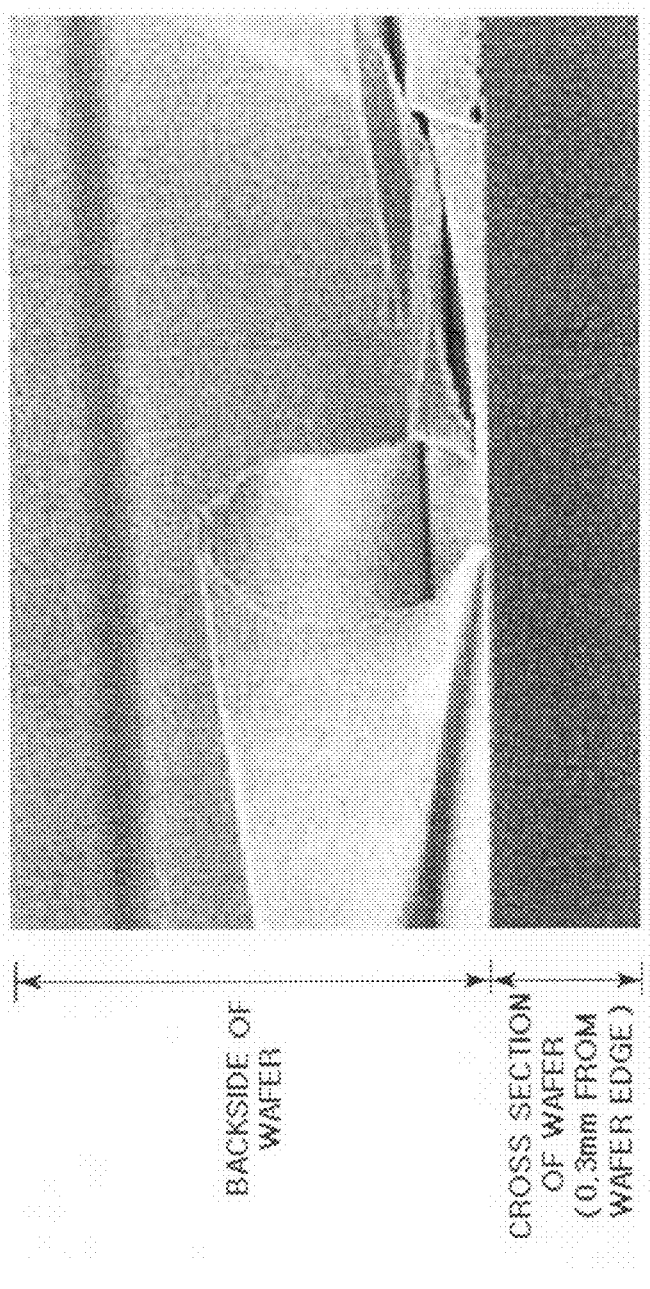

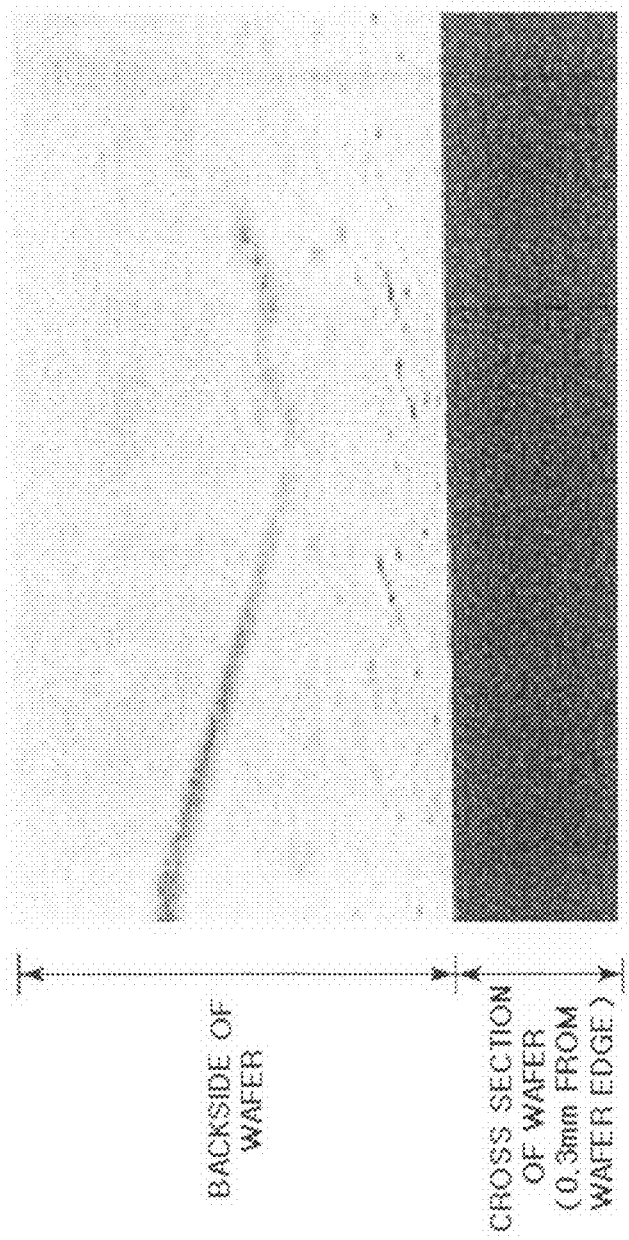

BEVEL/BACKSIDE POLYMER REMOVING METHOD AND DEVICE, SUBSTRATE PROCESSING APPARATUS AND STORAGE MEDIUM

FIELD OF THE INVENTION

The present invention relates to a method and a device for removing bevel/backside polymers adhering to the bevel surface and the backside of a substrate to be processed such as a semiconductor wafer or the like, a substrate processing apparatus provided with the bevel/backside polymer removing device, and a storage medium that stores a recipe for operating the substrate processing apparatus or the bevel/backside polymer removing device.

BACKGROUND OF THE INVENTION

In a manufacture of semiconductor integrated circuits, film-forming and etching are performed on a substrate to be processed such as a semiconductor wafer or the like. Some of these processes are performed by using plasma, wherein radicals and ions are generated. These radicals and ions can move around to thereby adhere to the bevel surface and the backside of the substrate to be processed, thus forming a deposit layer. In the present specification, the adhering substances that form the deposit layer are referred to as bevel/backside polymers (BSP). Especially, during an etching process for etching the substrate to be processed, the quantity of the bevel/backside polymers adhering to the substrate to be processed increases.

The bevel/backside polymers per se have heretofore been disregarded because they have been considered to have no great influence on the manufacture of semiconductor integrated circuits. In recent years, however, there have been revealed influences on the manufacture of semiconductor integrated circuits, which are considered to be related with the bevel/backside polymers.

The following three patent documents disclose conventional examples for removing polymers or dust, although they are not directed to a technique of removing bevel/backside polymers or eliminating the influence of bevel/backside polymers.

Japanese Patent Laid-open Application No. 2005-142524 discloses a bonding surface treatment method of a semiconductor wafer before bonding, in which polymers are removed by dry cleaning, wet cleaning, polishing, plasma-treatment or brushing in order to enhance the bonding between two semiconductor wafers.

Japanese Patent Laid-open Application No. 2006-032653 discloses a method for fabricating a semiconductor device in which polymers are removed by wet etching using laser heating in order to reduce heavy metal contamination of a silicon substrate containing an OSF (Oxidation-induced Staking Fault) and a bonding leak current.

Japanese Patent Laid-open Application No. 2001-332606 discloses a method for fabricating a semiconductor device in which dust is sucked after brushing the backside of a semiconductor wafer in order to remove dust from the backside of the semiconductor wafer.

SUMMARY OF THE INVENTION

In view of the above, the present invention provides a bevel/backside polymer removing method capable of reliably removing bevel/backside polymers, a bevel/backside polymer removing device using the bevel/backside polymer removing method, a substrate processing apparatus incorporating the bevel/backside polymer removing device, and a storage medium that stores a recipe for operating the substrate processing apparatus or the bevel/backside polymer removing device.

In accordance with a first aspect of the present invention, there is provided a bevel/backside polymer removing method for removing multi-layered bevel/backside polymers adhering to a bevel surface and a backside of a target substrate, the multi-layered bevel/backside polymers including an inorganic layer and an organic layer, the method including: a first step of mechanically destroying the multi-layered bevel/backside polymers; and a second step of heating residues of the multi-layered bevel/backside polymers mechanically destroyed.

In accordance with a second aspect of the present invention, there is provided a bevel/backside polymer removing device for removing multi-layered bevel/backside polymers adhering to a bevel surface and a backside of a target substrate, the multi-layered bevel/backside polymers including an inorganic layer and an organic layer, the device including: a target substrate holding mechanism for holding the target substrate while a peripheral edge portion of the target substrate is overhung; a rotating mechanism for rotating the target substrate holding mechanism; a destroying mechanism for mechanically destroying the multi-layered bevel/backside polymers adhering to the target substrate held by the target substrate holding mechanism; and a heating mechanism for heating the multi-layered bevel/backside polymers adhering to the target substrate held by the target substrate holding mechanism.

In accordance with a third aspect of the present invention, there is provided a substrate processing apparatus including: a loading/unloading chamber for loading and unloading a target substrate, the loading/unloading chamber having a port to which a transfer container for storage of the target substrate can be mounted, the port being capable of bringing the transfer container into communication with the loading/unloading chamber; a plurality of processing units for processing the target substrate; a transfer chamber capable of communicating with each of the processing units; a load lock chamber for interconnecting the loading/unloading chamber and the transfer chamber; a first transfer mechanism provided within the loading/unloading chamber capable of transferring the target substrate to and from each of the load lock chamber and the processing units; a bevel/backside polymer removing unit for removing the multi-layered bevel/backside polymers adhering to a bevel surface and a backside of the target substrate, the multi-layered bevel/backside polymers including an inorganic layer and an organic layer; and a second transfer mechanism provided within the loading/unloading chamber for transferring the target substrate to and from each of the transfer container, the load lock chamber and the bevel/backside polymer removing unit.

In accordance with a fourth aspect of the present invention, there is provided a storage medium operable in a computer and storing a program for controlling removal of bevel/backside polymers, wherein the program is adapted to, when executed, cause the computer to control a bevel/backside polymer removing device so that the bevel/backside polymer removing method of the first aspect can be performed.

With the present invention, it is possible to provide a bevel/backside polymer removing method capable of reliably removing bevel/backside polymers, a bevel/backside polymer removing device using the bevel/backside polymer removing method, a substrate processing apparatus incorporating the bevel/backside polymer removing device, and a storage medium that stores a recipe for operating the substrate processing apparatus or the bevel/backside polymer removing device.

BRIEF DESCRIPTION OF THE DRAWINGS

The object and features of the present invention will become apparent from the following description of embodiments given in conjunction with the accompanying drawings, in which:

FIG. 4 is a view showing the state of a wafer after irradiation of laser light in the first embodiment of the present invention;

FIGS. 17A to 17D are sectional views showing a mechanism of removing multi-layered bevel/backside polymers, which is presumed to work in a reference example;

FIG. 18 is a view showing the state of a wafer after irradiation of laser light in the reference example; and FIG. 19 is a view showing the state of a wafer after brushing in the reference example.

DETAILED DESCRIPTION OF THE EMBODIMENTS

Prior to describing embodiments, brief description will be made as to the influence of bevel/backside polymers on the manufacture of semiconductor integrated circuits and the actual condition of bevel/backside polymers in the up-to-date semiconductor integrated circuits, which have become known through the research made by the present inventors.

Figure 15A:
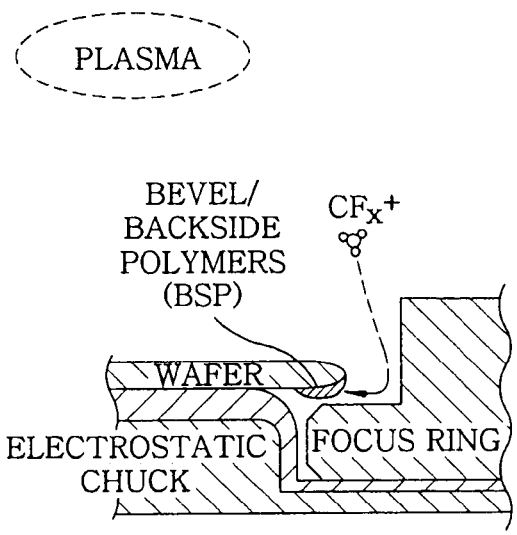
FIG. 15A is a sectional view illustrating a mounting state of a wafer within a process chamber.

While processing a substrate to be processed, e.g., a semiconductor wafer (hereinafter referred to as a "wafer"), bevel/backside polymers adhere to a bevel surface and a backside of the wafer. One of the reasons for this is that ions and radicals in plasma move toward the bevel surface and the backside of the wafer. FIG. 15A illustrates a mounting state of the wafer in a process chamber.

As illustrated in FIG. 15A, the wafer is mounted on a stage (an electrostatic chuck) in a state that the edge thereof extends outwardly beyond the stage.

Although a focus ring for defining the mounting position of the wafer is arranged around the edge of the wafer, there exists a small clearance between the focus ring and the wafer. Ions and radicals move over the bevel surface and the backside of the wafer through this clearance and adhere thereto. This is the bevel/backside polymers. Examples of the ions and radicals include carbon fluoride-based ions and radicals (hereinafter, referred to as "$CF_x^+$") generated in the plasma while etching a low-k dielectric film (a low-k film). As the $CF_x^+$ adheres to the bevel surface and the backside of the wafer, an organic layer is formed thereon.

Examples of the influence on the wafer presumably of the bevel/backside polymers include the followings.

Figure 15B:
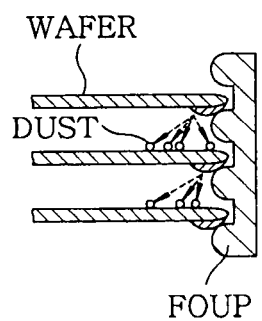
FIGS. 15B to 15D are views illustrating the influence on a wafer, presumably of bevel/backside polymers.

(1) When a wafer to which bevel/backside polymers adhere is put into a transfer container (a FOUP, i.e., a Front Opening Unified Pod) for transferring the wafer, the bevel/backside polymers are scraped against the support portion of the FOUP as illustrated in FIG. 15B, thereby generating dust. The dust falls down to thereby adhere to the surface of the wafer arranged on the lower side. The dust adhering to the surface of the wafer becomes a defect-causing factor later.

Figure 15C:
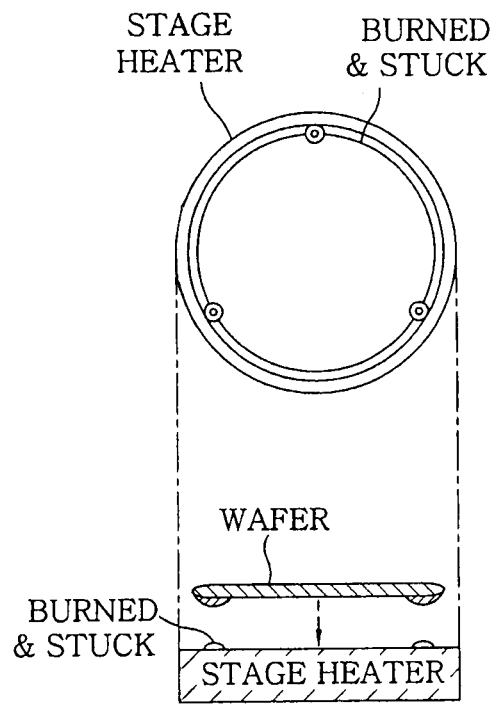

(2) If the wafer to which the bevel/backside polymers adhere is mounted on a stage heater for heating the same, the bevel/backside polymers are transferred to the surface of the stage heater as illustrated in FIG. 15C. In such instance, the bevel/backside polymers are burned and stuck to the surface of the stage heater.

Figure 15D:
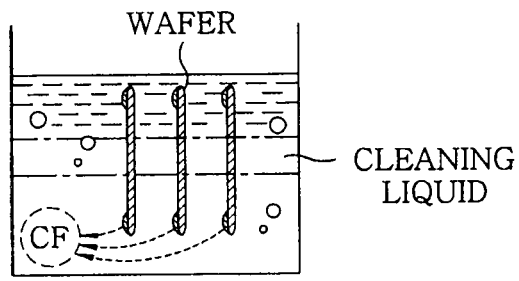

(3) In case where the wafer to which the bevel/backside polymers adhere is immersed in a cleaning basin for cleaning, components of the bevel/backside polymers (e.g., carbon and fluorine) are dissolved in the cleaning liquid as illustrated in FIG. 15D, thus contaminating the cleaning liquid. This makes it necessary to replace the cleaning liquid in an increased frequency.

In view of these circumstances, the present inventors have conducted research in an effort to remove the bevel/backside polymers and to reduce the influence of the bevel/backside polymers on the manufacture of semiconductor integrated circuits.

The bevel/backside polymers are generated in a particularly large quantity after the plasma etching. Therefore, it is preferred that the bevel/backside polymers are removed after the plasma etching.

However, in case where an attempt is made to remove the bevel/backside polymers in the back-end on line (BEOL) of a wafer process whose major step is a wiring formation step, it is difficult to perform a wet treatment, particularly to use strong liquid chemical, since the strong liquid chemical may possibly affect on the metallic material as wiring lines and the Low-k material as interlayer insulation films.

As an alternative, the present inventors have studied what is called sputtering, in which the bevel/backside polymers are dislodged by allowing charged particles, such as ions or the like, to locally impinge on an area extending from the bevel surface to the backside of the wafer. However, most of the bevel/backside polymers adhere to a narrow region extending about 5 mm inwardly from the edge of the wafer. This region joins to the bevel surface and therefore is quite weak. Since the bevel/backside polymers themselves are also considerably thin, the charged particles penetrate the bevel/backside polymers and then reach the wafer. This may possibly destroy the wafer itself, thereby making it difficult to keep the wafer shape intact.

As a further alternative, the present inventors have attempted to remove the bevel/backside polymers through a chemical reaction by using a processing gas. This attempt is presented as a reference example. In the reference example, a local heating method is employed in order to locally accelerate the reaction in a narrow region extending about 5 mm inwardly from the edge of the wafer. One example of the local heating method is laser heating. In this attempt, however, it was impossible to completely remove all of the bevel/backside polymers. One of the reasons for this is that the actual bevel/backside polymers are not a simple organic layer formed of, e.g., $CF_x^+$ adhering to the wafer but a multi-layered film (hereinafter referred to as "multi-layered bevel/backside polymers") having organic layers and inorganic layers mixed. The cross section of the multi-layered bevel/backside polymers is typically illustrated in FIG. 16.

Figure 16:
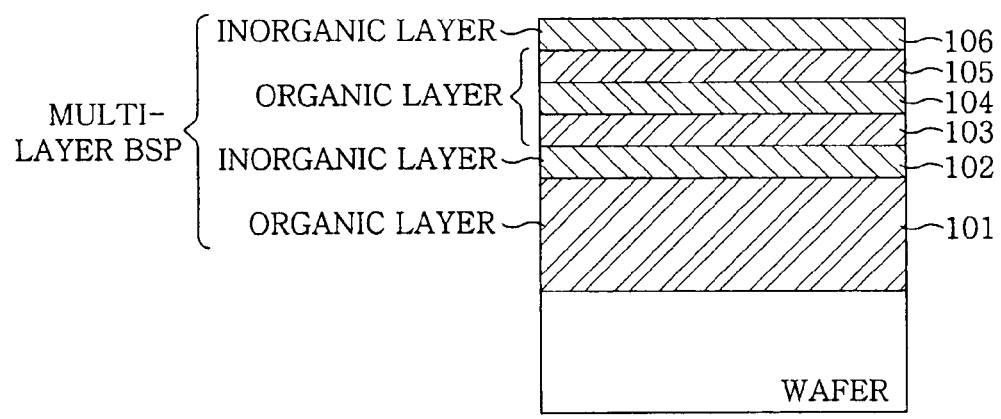
FIG. 16 is a sectional view typically illustrating multi-layered bevel/backside polymers.

As shown in FIG. 16, the multi-layered bevel/backside polymers include, e.g., a first organic layer 101, a first inorganic layer 102, second to forth organic layers 103, 104 and 105, and a second inorganic layer 106, which are sequentially laminated on the backside of the wafer in order. It is believed that the first to fourth organic layers 101, 103, 104 and 105 are formed of $CF_x^+$ scattered when etching a film containing carbon or fluorine, e.g., a low-k film. The first inorganic layer 102 and the second inorganic layer 106 are silicon oxide-based layers (hereinafter, referred to as "$SiO_x$ layers"). The $SiO_x$ layers may be formed by the oxidation of silicon contained in the low-k film or by the chemical combination of silicon (Si) with oxygen (O) scattered in a plasma process using an oxygen gas ($O_2$) or an ozone gas ($O_3$), e.g., in a resist-ashing process.

A mechanism of removing the multi-layered bevel/backside polymers, which is presumed to work in the reference example, is shown in FIGS. 17A through 17D.

If laser light is irradiated on the wafer while rotating the wafer as shown in FIG. 17A and injecting an ozone gas on the multi-layered bevel/backside polymers of the wafer as shown in FIG. 17B, heat is transferred from the interior of the wafer to the surface thereof, thus heating the multi-layered bevel/backside polymers. Since the organic layers and the inorganic layers have different thermal expansion coefficients, the multi-layered bevel/backside polymers cannot endure the difference in thermal expansion coefficients and will crack soon. The injected ozone gas infiltrates into the multi-layered bevel/backside polymers through the cracked portions and reacts with carbon or fluorine present in the organic layers. This results in, e.g., volatilization of the organic layers. However, the ozone gas does not volatilize the inorganic layers ($SiO_x$ layers) but, instead, accelerates oxidization thereof. Moreover, the ozone gas oxidizes the wafer which is made of silicon.

Due to the volatilization of the organic layers and the non-volatilization of the inorganic layers in the reaction stated above, only the inorganic layers are left on the wafer as illustrated in FIG. 17C. Furthermore, since the wafer is being oxidized by the ozone gas, an oxide layer is built up toward the inorganic layers. Consequently, the inorganic layers will come into contact with the wafer and will stick to the wafer.

After removing the bevel/backside polymers, the inorganic layers stuck to the wafer and the cracked portions of the inorganic layers floating upwardly away from the wafer by thermal shrinkage are left on the wafer as residues as illustrated in FIG. 17D. FIG. 18 shows the state of the wafer after irradiation of the laser light together with injection of the ozone gas in the reference example. Shown in FIG. 18 is an actual scanning electron microscope (SEM) image of the wafer (the portion 0.3 mm away from the edge of the wafer). As shown in FIG. 18, the residues floating away from the wafer are clearly seen in the backside of the wafer (represented in a perspective view).

After the process shown in FIG. 17D, brushing was performed to remove the residues. Although the floating residues were removed by the brushing, it was impossible to remove the residues stuck to the wafer. FIG. 19 shows the state of the wafer after brushing in the reference example. Shown in FIG. 19 is an actual scanning electron microscope image of the wafer. It can be seen in FIG. 19 that the inorganic layers were left on the wafer, although the floating residues had been removed.

In the attempt mentioned above, the wafer was locally heated by laser light so that the heating temperature could be instantaneously increased to about 300° C. It is presumed that the influence of this heating temperature may result in increasing the adhesion property between the inorganic layers and the wafer and enhancing the bond therebetween.

Hereinafter, an exemplary embodiment of the present invention will be described with reference to FIGS. 1 to 19, which form a part hereof.

First Embodiment

Figure 1:
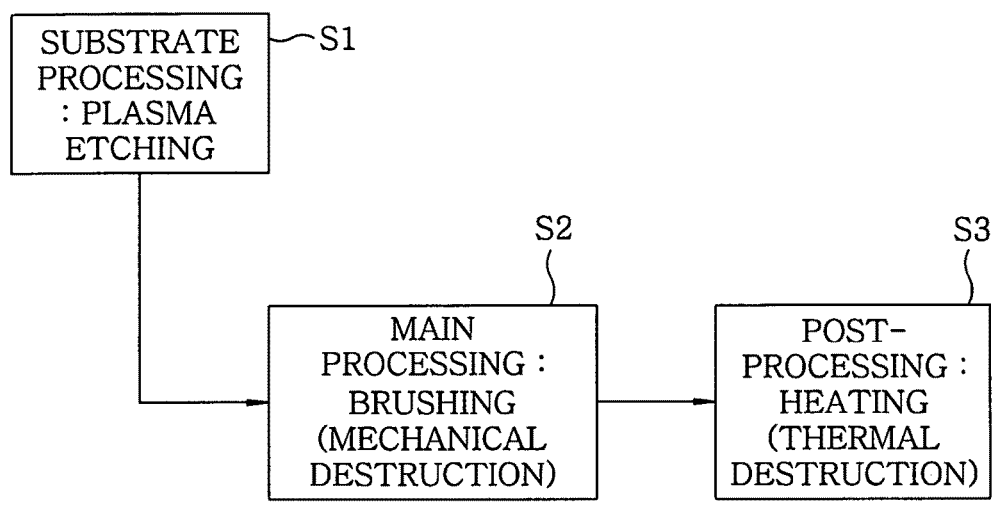
FIG. 1 is a flowchart illustrating one example of a bevel/backside polymer removing method in accordance with a first embodiment of the present invention.

Based on the knowledge obtained through the afore-mentioned attempts, the processing flow shown in FIG. 1 was employed as a bevel/backside polymer removing method in accordance with a first embodiment of the present invention.

FIG. 1 is a flowchart illustrating one example of the bevel/backside polymer removing method in accordance with the first embodiment of the present invention.

As shown in FIG. 1, a target substrate, i.e., a semiconductor wafer in this example, is subjected to a substrate processing, e.g., a plasma etching, and more specifically, a plasma etching of an interlayer insulation film (a low-k film) (step S1). Then, the bevel surface and the backside of the target substrate that has undergone the substrate processing are brushed (step S2). After brushing, the bevel surface and the backside of the target substrate are heated (step S3).

In the bevel/backside polymer removing method of the present embodiment, a pre-processing such as the plasma etching or the like is first performed on the target substrate and then the target substrate is brushed from the bevel surface to the backside thereof. This brushing includes a main processing for removal of the bevel/backside polymers.

An ozone gas is used in the afore-mentioned attempts, which means that the main processing thereof is a chemical reaction. In this example, however, the main processing is not a chemical reaction but brushing, i.e., a mechanical destruction. In this example, the multi-layered bevel/backside polymers are mechanically destroyed and removed.

However, the multi-layered bevel/backside polymers cannot be completely removed by merely mechanically destroying them. Therefore, heating is employed as a post-processing. The heating plays a role in promoting chemical reaction. In this example, however, the heating is performed to positively induce the thermal crack of the bevel/backside polymers, which is the knowledge obtained through the aforementioned attempts. In other words, the purpose of this heating resides in that the residues of the multi-layered bevel/backside polymers on the target substrate are thermally destroyed and peeled off by using the difference between the thermal expansion coefficient of the multi-layered bevel/backside polymers and that of the target substrate. The heating temperature is in a range, e.g., from 200° C. to 300° C.

In the manner noted above, the multi-layered bevel/backside polymers are first mechanically destroyed, thereby removing inorganic layers included in the multi-layered bevel/backside polymers. After removing the inorganic layers from the multi-layered bevel/backside polymers, the residues of the multi-layered bevel/backside polymers are heated to destroy and peel off the same from the target substrate.

In this example, the bevel/backside polymers are removed from the target substrate through two steps, i.e., the mechanical destruction and the thermal destruction. This makes it possible to reliably remove the bevel/backside polymers. Even if the bevel/backside polymers include an inorganic layer as is the case in the multi-layered bevel/backside polymers, it is possible to remove the bevel/backside polymers in a reliable manner.

One example of the mechanical destruction used in the main processing is brushing as illustrated in FIG. 1.

One example of the heating method used in the post-processing is a local and instantaneous heating method. In this method, it is possible to instantaneously apply an intensive thermal shock to the residues of the multi-layered bevel/backside polymers. Responsive to this thermal shock, the residues of the multi-layered bevel/backside polymers are instantaneously and rapidly expanded. By rapidly expanding the residues of the multi-layered bevel/backside polymers, it is possible to peel off them from the target substrate more efficiently than when slowly expanding them. One example of the local and instantaneous heating method is laser light irradiation.

Figure 2:
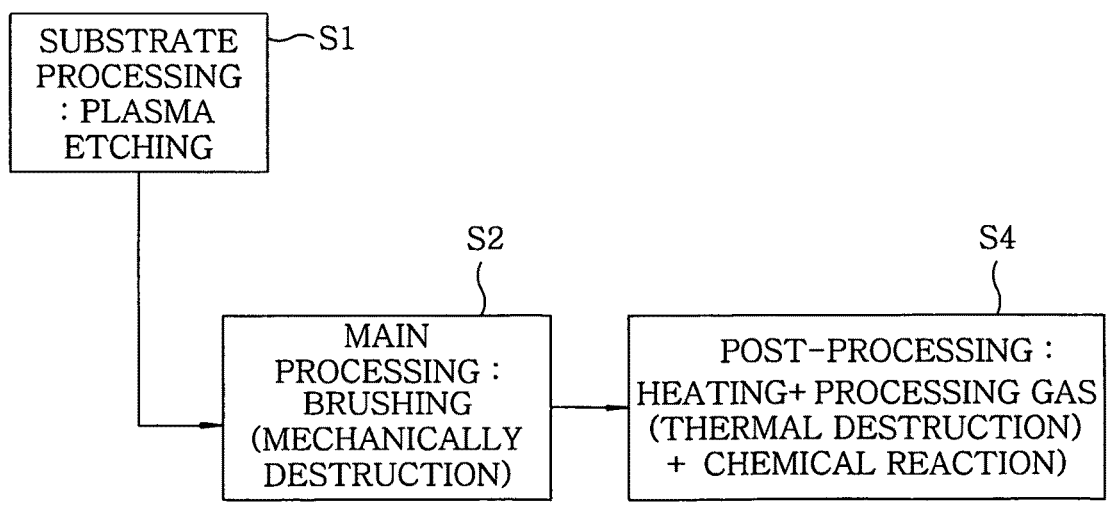
FIG. 2 is a flowchart illustrating another example of the bevel/backside polymer removing method in accordance with the first embodiment of the present invention.

FIG. 2 is a flowchart illustrating another example of the bevel/backside polymer removing method in accordance with the first embodiment of the present invention.

As can be seen in FIG. 2, heating and chemical reaction may be used in combination in the post-processing (step S4). By using chemical reaction in combination with heating, it is possible to thermally destroy and chemically peel off the residues of the multi-layered bevel/backside polymers. In an instance where the residues of the multi-layered bevel/backside polymers include organic layers, a processing gas for reaction with the organic layers is injected from the bevel surface to the backside of the target substrate. As a consequence, chemical reaction occurs in the organic layers included in the residues of the multi-layered bevel/backside polymers. This makes it possible to chemically peel off, e.g., chemically volatilize, the residues of the multi-layered bevel/backside polymers.

By using heating and chemical reaction in combination in the post-processing as noted above, it is possible to more efficiently remove the residues of the multi-layered bevel/backside polymers. One example of the processing gas is an ozone gas.

If it is concerned that the ozone gas advances the reaction too far or costs too much for attendant installations such as an ozonizer and the like, the processing gas may be replaced with an oxygen gas.

The processing gas is not limited to the ozone gas and the oxygen gas but may be other gases that react with the multi-layered bevel/backside polymers and preferably volatilize the organic layers. Examples of such gases include $CF_4$, $C_xF_y$, $CHF_3$, $CH_zF_y$, HF and $Cl_2$.

In case where the target substrate is a semiconductor wafer, e.g., a silicon wafer, capable of reacting with oxygen, it may be possible to use a processing gas that can react well with the residues of the multi-layered bevel/backside polymers but hardly reacts with the target substrate. One example of this processing gas is a nitrogen gas ($N_2$).

The post-processing may well be performed in the atmosphere without using the processing gas.

The water vapor in the atmosphere may act as an oxidizing agent that reacts with the target substrate. In case where it is necessary to prevent the water vapor in the atmosphere from reacting with the target substrate, it may be possible to inject a dry air free from water vapor toward the residues of the multi-layered bevel/backside polymers.

Next, description will be made regarding one example of the effects provided by the bevel/backside polymer removing method of the first embodiment.

This example is directed to an example in which brushing is used as the main processing and laser irradiation is used in combination with ozone gas injection as the post processing.

FIGS. 3A to 3D show a mechanism of removing the multi-layered bevel/backside polymers, which is presumed to work in this example.

Figure 3A:
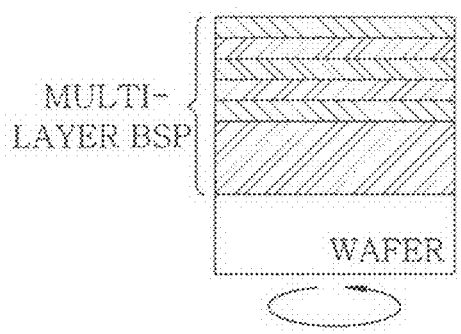
FIGS. 3A to 3D are sectional views showing a mechanism of removing multi-layered bevel/backside polymers, which is presumed to work in the first embodiment of the present invention.
Figure 3B:
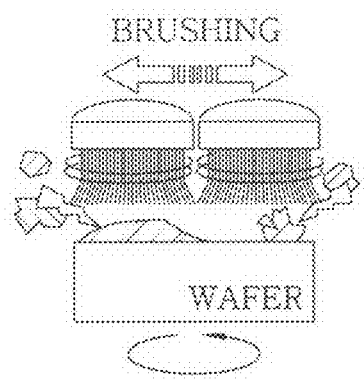

The wafer is rotated as shown in FIG. 3A and then brushed with a brush as shown in FIG. 3B. As a result, the multi-layered bevel/backside polymers are mechanically destroyed and the inorganic layers are removed from the multi-layered bevel/backside polymers.

Figure 3C:
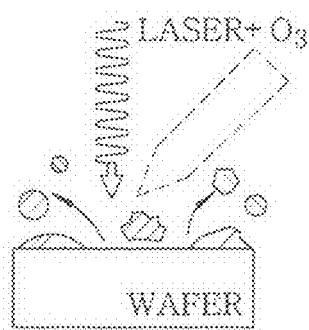

Next, as shown in FIG. 3C, an ozone gas is injected toward the multi-layered bevel/backside polymers from which the inorganic layers are removed, while irradiating laser light thereon. As a consequence, the residues of the multi-layered bevel/backside polymers are thermally destroyed and peeled off from the wafer. In addition, the ozone gas reacts with the organic layers, particularly carbon or fluorine, included in the residues of the multi-layered bevel/backside polymers, thereby volatilizing the organic layers.

Figure 3D:
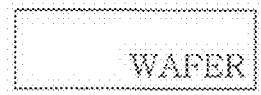

After the removal processing, the multi-layered bevel/backside polymers are removed from the wafer as shown in FIG. 3D. FIG. 4 shows the state of the wafer after irradiation of laser light in this example. Shown in FIG. 4 is an actual scanning electron microscope (SEM) image. It can be seen in FIG. 4 that the multi-layered bevel/backside polymers have been removed from the wafer.

In the manner mentioned above, it was possible to remove the multi-layered bevel/backside polymers in this example.

No wet processing is employed in removing the multi-layered bevel/backside polymers. In other words, no strong liquid chemical is used in the removal process. Therefore, it is possible to remove the bevel/backside polymers even in the back-end on line of the wafer process.

Further, charged particles such as ions and the like are not used in the removal process. In other words, the bevel/backside polymers do not sputter, which means that the wafer is hardly destroyed. For that reason, the possibility of destroying the wafer per se is low as compared to a case where the bevel/backside polymers are removed by sputtering.

Therefore, the bevel/backside polymer removing method in accordance with the present embodiment is capable of reliably removing the bevel/backside polymers and is advantageously applicable to an actual manufacturing process.

Second Embodiment

Next, one example of a bevel/backside polymer removing device for performing the bevel/backside polymer removing method of the first embodiment described above will be explained as a second embodiment.

Figure 5A:
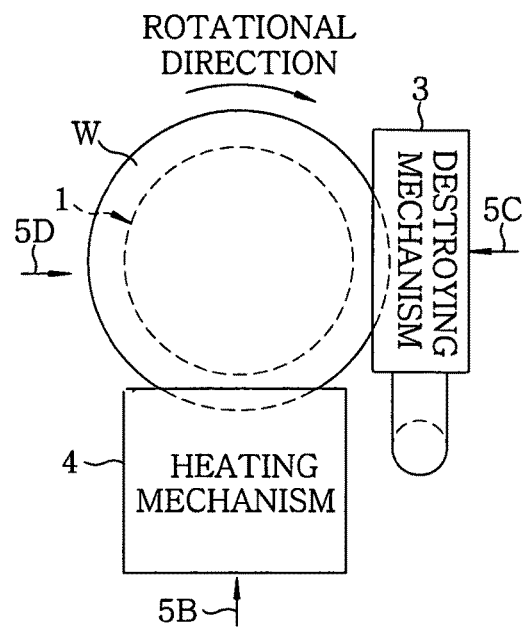
FIGS. 5A to 5D are views schematically illustrating one example of a bevel/backside polymer removing device in accordance with a second embodiment of the present invention.
Figure 5B:
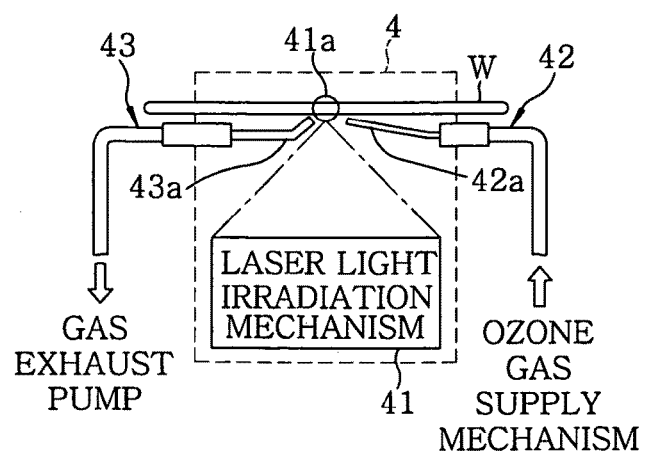

FIGS. 5A to 5D are views schematically illustrating one example of a bevel/backside polymer removing device in accordance with a second embodiment of the present invention. FIG. 5A is a plan view of the device, FIG. 5B being a side view of the device as seen in the direction of arrow 5B in FIG. 5A, FIG. 5C being a side view of the device as seen in the direction of arrow 5C in FIG. 5A, and FIG. 5D being a side view of the device as seen in the direction of arrow 5D in FIG. 5A.

The bevel/backside polymer removing device of the present embodiment includes a target substrate holding mechanism 1 for holding a target substrate, i.e., a semiconductor wafer W in this example, a rotating mechanism 2 for rotating the target substrate holding mechanism 1, a destroying mechanism 3 for mechanically destroying bevel/backside polymers adhering to the wafer W, i.e., multi-layered bevel/backside polymers in this example, and a heating mechanism 4 for heating the multi-layered bevel/backside polymers.

The target substrate holding mechanism 1 serves to hold wafer W, while the peripheral edge portion of the wafer W is overhung outwardly beyond a holding stage 11.

The rotating mechanism 2 serves to rotate the target substrate holding mechanism 1, i.e., the holding stage 11 in this example, in a direction from the destroying mechanism 3 toward the heating mechanism 4.

The destroying mechanism 3 includes a brushing mechanism 31 for brushing the peripheral edge portion of the wafer W, i.e., the bevel surface and the backside of the wafer W in this example, and a suction/exhaust mechanism 32 for sucking and exhausting the multi-layered bevel/backside polymers destroyed by the brushing mechanism 31.

The brushing mechanism 31 of this example includes a bevel surface brush 31a for brushing the bevel surface, a backside brush 31b for brushing the backside, a brush rotating mechanism 31c for rotating the bevel surface brush 31a, a brush rotating mechanism 31d for rotating the backside brush 31b and an up-and-down actuator 31e for simultaneously raising or lowering the brushes 31a and 31b and the mechanisms 31c and 31d.

The bevel surface brush 31a can be tilted relative to the backside so that it can brush the bevel surface of backside inclined with respect to the backside of the wafer W. In contrast, the backside brush 31b that serves to brush the backside is mounted in an essentially perpendicular relationship with the backside. The backside brush 31b employed in this example is adapted to brush the backside region extending about 5 mm from the edge of the wafer W.

With the brushing mechanism 31 of this example, the peripheral edge portion of the semiconductor wafer W in rotation, i.e., the bevel surface of backside in this example, and the backside region extending about 5 mm from the edge of the wafer W are brushed by the rotating brushes 31a and 31b, thereby mechanically destroying the multi-layered bevel/backside polymers adhering to the wafer. The multi-layered bevel/backside polymers thus mechanically destroyed are scattered in the form of dust. In this example, the dust thus scattered is sucked and exhausted by means of the suction/exhaust mechanism 32.

The suction/exhaust mechanism 32 employed in this example includes a suction fan 32a for sucking the dust scattered. The suction fan 32a is connected to a suction duct 32b. The dust sucked by the suction fan 32a is exhausted toward a waste disposing mechanism (not shown) through the suction duct 32b and is disposed in the waste disposing mechanism.

The heating mechanism 4 includes a laser light irradiation mechanism 41 for locally heating the peripheral edge portion of the wafer W, i.e., the bevel surface and the backside in this example, a processing gas injection mechanism 42 for injecting a processing gas toward the bevel surface and the backside, and a gas exhaust mechanism 43 for exhausting the interior of the heating mechanism 4.

In this example, a semiconductor laser having a wavelength of 808 nm, a laser spot area of 0.5 to 3 mm and a laser power of 200 W is used as a laser light source of the laser light irradiation mechanism 41. With this semiconductor laser, a spot area on the peripheral edge portion of the wafer W can be locally heated to a temperature from 200° C. to 300° C.). More specifically, if a focal length is set equal to about 0.6 mm, it is possible to locally heat the spot area on the peripheral edge portion of the wafer W to a temperature of about 300° C. In this example, an ozone gas ($O_3$) is used as the processing gas injected by the processing gas injection mechanism 42. The ozone gas is supplied from an ozone gas supply mechanism (not shown). A nozzle 42a for injecting the ozone gas is arranged, e.g., near a laser spot 41a on which laser light is irradiated. The ozone gas injected from the nozzle 42a moves toward the laser spot 41a, i.e., the region of the wafer W to be locally heated.

The processing gas injection mechanism 42 may be omitted in the event that the bevel/backside polymers are removed in the atmosphere. In case where the processing gas injection mechanism 42 is already installed, the processing gas may be supplied only if such a need arises. Also, the processing gas is not limited to the ozone gas as mentioned earlier with respect to the first embodiment.

The gas exhaust mechanism 43 has a gas exhaust port 43a positioned near the laser spot 41a so that the ozone gas injected toward the laser spot 41a can be exhausted through the exhaust port 43a. The gas exhaust port 43a is connected to the gas exhaust pump (not shown).

With the bevel/backside polymer removing device described above, the wafer W is rotated together with the holding stage 11 by means of the rotating mechanism 2. The multi-layered bevel/backside polymers are mechanically destroyed with the destroying mechanism 3, after that the residues of the multi-layered bevel/backside polymers are heated with the heating mechanism 4. Therefore, as mentioned earlier in respect of the first embodiment, it is possible to reliably remove the bevel/backside polymers even if the bevel/backside polymers are multi-layered bevel/backside polymers including organic layers and inorganic layers.

Third Embodiment

Next, one example of a substrate processing apparatus provided with the bevel/backside polymer removing device will be described as a third embodiment of the present invention.

As described above, it is often the case that the multi-layered bevel/backside polymers adhere to the wafer after plasma-etching an interlayer insulation film. For that reason, it is preferred that the bevel/backside polymer removing device described above in respect of the second embodiment is integrally built in a substrate processing apparatus which performs the plasma etching.

Figure 6:
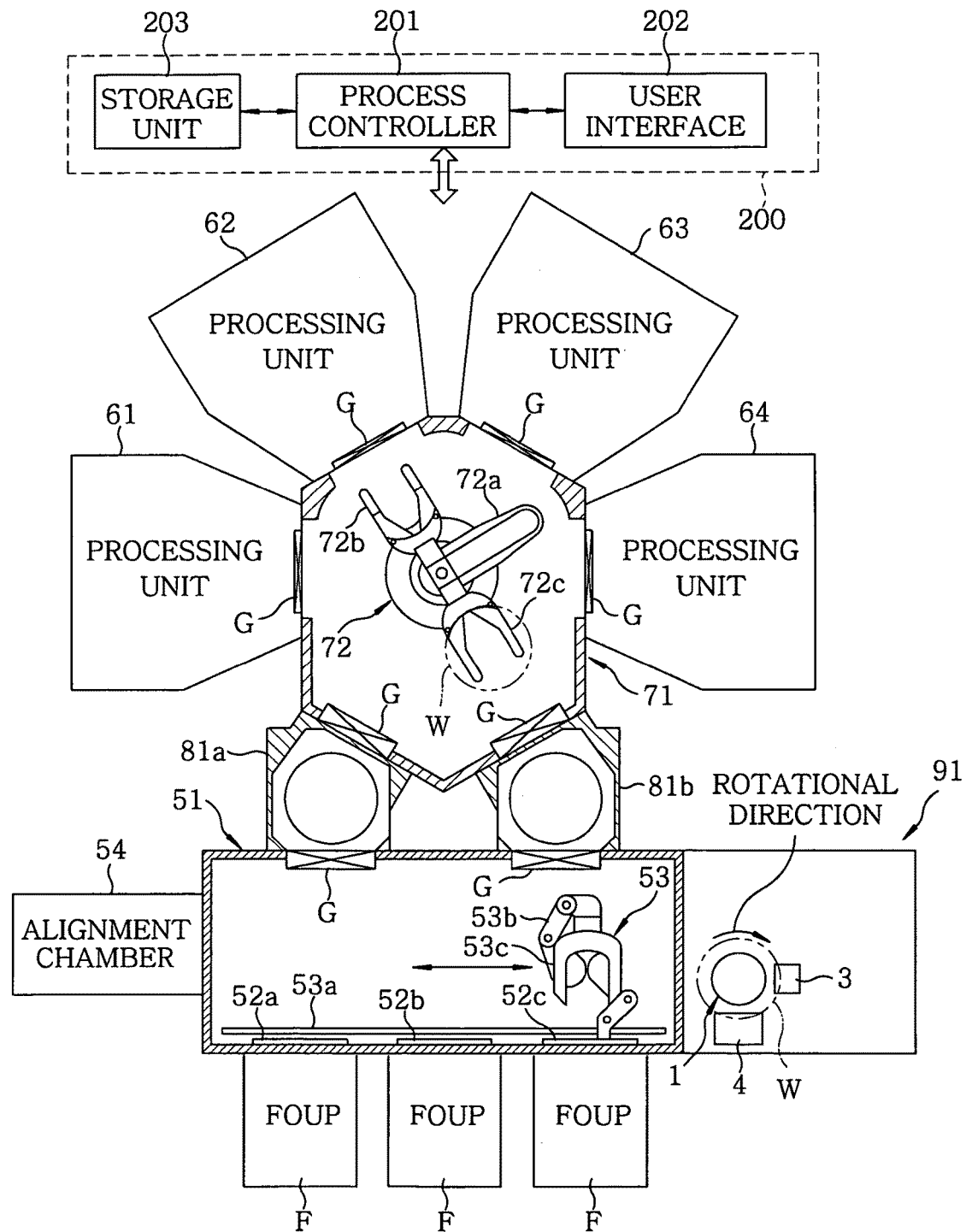
FIG. 6 is a horizontal section view schematically illustrating one example of a substrate processing apparatus in accordance with a third embodiment of the present invention.

FIG. 6 is a horizontal section view schematically illustrating one example of the substrate processing apparatus in accordance with the third embodiment of the present invention. The substrate processing apparatus of this example is a multi-chamber type apparatus having a plurality of processing chambers and also having a bevel/backside polymer removal function.

As shown in FIG. 6, the substrate processing apparatus of this example having the bevel/backside polymer removal function includes: a loading/unloading chamber 51 through which a target substrate, i.e., a semiconductor wafer W in this example, is loaded and unloaded; at least one port, e.g., three ports 52a to 52c in this example, provided in the loading/unloading chamber 51, the ports 52a to 52c designed to allow FOUPs (Front Opening Unified Pods) F, e.g., transfer containers for storage of the semiconductor wafer W in this example, to communicate with the loading/unloading chamber 51 therethrough, the FOUPs being attached to the ports 52a to 52c; a plurality of processing units, e.g., four processing units 61 to 64 in this example, for processing the wafer W; a transfer chamber 71 being capable of communicating with each of the processing units 61 to 64; at least one load lock chamber, e.g., two load lock chambers 81a and 81b in this example, for interconnecting the loading/unloading chamber 51 and the transfer chamber 71; a first transfer mechanism 72 provided within the transfer chamber 71 for transferring the wafer W to and from each of the load lock chambers 81a and 81b and the processing units 61 to 64; a bevel/backside polymer removing unit 91 for removing multi-layered bevel/backside polymers, the bevel/backside polymer removing unit 91 being capable of communicating with the loading/unloading chamber 51; and a second transfer mechanism 53 provided within the loading/unloading chamber 51 for transferring the wafer W to and from each of the FOUPs F, the load lock chambers 81a and 81b and the bevel/backside polymer removing unit 91.

The processing units 61 to 64 are installed in a corresponding relationship with four sides of the transfer chamber 71 that has a hexagonal shape. The load lock chambers 81a and 81b are installed on the remaining two sides of the transfer chamber 71, respectively. The loading/unloading chamber 51 is installed on the opposite side of the transfer chamber 71 with load lock chambers 81a and 81b therebetween. The ports 52a to 52c to which the FOUPs F are mountable are installed on a side of the loading/unloading chamber 51 opposing a side to which the load lock chambers 81a and 81b are installed.

The processing units 61 to 64 perform a predetermined vacuum processing, e.g., etching and film-forming, on the wafer W mounted on an internally-arranged processing plate (not shown).

The processing units 61 to 64 and the load lock chambers 81a and 81b are connected to the respective sides of the transfer chamber 71 through gate valves G. Each of the processing units 61 to 64 and the load lock chambers 81a and 81b is brought into communication with the transfer chamber 71 upon opening a corresponding one of the gate valves G but disconnected from the transfer chamber 71 upon closing the corresponding gate valve G. The transfer chamber 71 is held at a predetermined vacuum level, just like the interior of the processing units 61 to 64.

The load lock chambers 81a and 81b are also connected to the loading/unloading chamber 51 through respective gate valves G. Each of the load lock chambers 81a and 81b is brought into communication with the loading/unloading chamber 51 upon opening a corresponding one of the gate valves G but disconnected from the loading/unloading chamber 51 upon closing the corresponding gate valve G. The pressure within the load lock chambers 81a and 81b can be controlled to be kept at a pressure ranging between the same vacuum level as available in the transfer chamber 71 and the atmospheric pressure as available in the loading/unloading chamber 51.

In this example, the first transfer mechanism 72 arranged in the transfer chamber 71 includes a rotatable and extensible/contractible portion 72a arranged substantially at the center of the transfer chamber 71 and two support arms 72b and 72c for supporting the wafer W, the support arms 72b and 72c being attached to the rotatable and extensible/contractible portion 72a in a mutually oppositely extending relationship. Although the twin type support arms are employed in this example, it may be possible to use a single type support arm.

Shutters (not shown) are installed in the ports 52a to 52c. If the FOUPs F are attached to the ports 52a to 52c, the shutters are removed to thereby bring the interior of the FOUPs F into communication with the loading/unloading chamber 51.

In this example, the second transfer mechanism 53 includes a multi-joint arm 53b which moves along a rail 53a arranged parallel to the ports 52a to 52c. A hand 53c for supporting the wafer W is attached to the tip end of the multi-joint arm 53b.

The bevel/backside polymer removing unit 91 is provided at one end of the rail 53a of the loading/unloading chamber 51. An alignment chamber 54 is installed at the other end of the rail 53a of the loading/unloading chamber 51.

The bevel/backside polymer removing unit 91 is provided with the bevel/backside polymer removing device as described earlier in respect of the second embodiment. The bevel/backside polymer removing unit 91 employed in this example includes a target substrate holding mechanism 1 for holding the wafer W with the edge thereof kept in an overhung state, the target substrate holding mechanism 1 being rotatable by a rotating mechanism, a destroying mechanism 3 and a heating mechanism 4. The alignment chamber 54 performs alignment of the direction of the wafer W.

The substrate processing apparatus of this example with the bevel/backside polymer removal function is controlled by a control unit 200. The control unit 200 employed in this example includes a process controller 201 that controls the substrate processing apparatus.

A user interface 202 is connected to the process controller 201. The user interface 202 includes a keyboard through which an operator performs a command input or other operations to manage the substrate processing apparatus, a display for visually displaying the operating conditions of the substrate processing apparatus, and so forth.

A storage unit 203 is connected to the process controller 201. The storage unit 203 stores a control program for causing the substrate processing apparatus to perform its processing under the control of the process controller 201 and a program, i.e., recipes, for causing the processing units 61 to 64 to perform their processing under specified processing conditions or for causing the bevel/backside polymer removing unit 91 to perform the bevel/backside polymer removing method as described earlier in respect of the first embodiment. The recipes are stored in a storage medium provided within the storage unit 203. The storage medium may be a hard disk, a semiconductor memory or a portable memory such as a CD-ROM, a DVD and a flash memory. If necessary, an arbitrary one of the recipes is read out from the storage unit 203 under the instruction inputted through the user interface 202 and is executed by the process controller 201. Thus, under the control of the process controller 201, the processing units 61 to 64 perform desired processing, and the bevel/backside polymer removing unit 91 performs bevel/backside polymer removal processing. Alternatively, the recipes may be suitably transmitted from other devices via a dedicated transmission line.

With the substrate processing apparatus of this example having the bevel/backside polymer removal function, the wafer W completely processed in the processing units 61 to 64 can be stored in the FOUPs F in a state that the bevel/backside polymers have been removed from the wafer W. This is because the bevel/backside polymer removing unit 91 is connected to the loading/unloading chamber 51.

In other words, the wafer W processed in the processing units 61 to 64 is transferred to the loading/unloading chamber 51 and then to the bevel/backside polymer removing unit 91. Bevel/backside polymers are removed from the processed wafer W in the bevel/backside polymer removing unit 91. After that, the wafer W from which the bevel/backside polymers have been removed is stored in the FOUPs F and unloaded from the loading/unloading chamber 51.

With the substrate processing apparatus having the bevel/backside polymer removal function, the wafer W is restrained from being unloaded with the bevel/backside polymers adhering thereto. This reduces the possibility that the bevel/backside polymers contaminate the FOUPs F, the additional substrate processing apparatus used in post-processing or the rinsing solution and the possibility that the bevel/backside polymers are burned and stuck to the stage heater.

Therefore, the substrate processing apparatus of this example having the bevel/backside polymer removal function is advantageously applicable to an actual manufacturing line and advantageously usable in increasing the quality of actually manufactured semiconductor integrated circuits.

Bevel/backside polymers are apt to adhere to the wafer W after the interlayer insulation film has been plasma-etched. Therefore, the substrate processing apparatus of this example having the bevel/backside polymer removal function is preferably applicable to a substrate processing apparatus in which one of the processing units 61 to 64 includes a plasma etching unit for plasma-etching the interlayer insulation film formed on the wafer W.

Plasma containing oxygen is used in ashing a photoresist. In the midst of the plasma containing oxygen, inorganic layers are quite easily formed in the bevel/backside polymers. Therefore, the substrate processing apparatus of this example having the bevel/backside polymer removal function is also preferably applicable to a substrate processing apparatus in which one of the processing units 61 to 64 includes a plasma ashing unit for ashing a photoresist formed on an interlayer insulation film and used as a mask when etching the interlayer insulation film. In addition, the substrate processing apparatus of this example may be applied to a substrate processing apparatus in which two of the processing units 61 to 64 include the plasma etching unit and the plasma ashing unit.

The substrate processing apparatus of this example is more preferably applicable in case when an interlayer insulation film, i.e., a so-called low-k film containing carbon or fluorine, is etched by the plasma etching unit.

While four processing units are employed in this example, the number of the processing units is not limited thereto.

Fourth Embodiment

While the bevel/backside polymers are removed through two steps, i.e., the pre-processing and the post-processing, in the first embodiment, the method of removing the bevel/backside polymers is not limited thereto but may be modified. Hereinafter, a number of modified examples will be described as a fourth embodiment.

First Example

Figure 7:
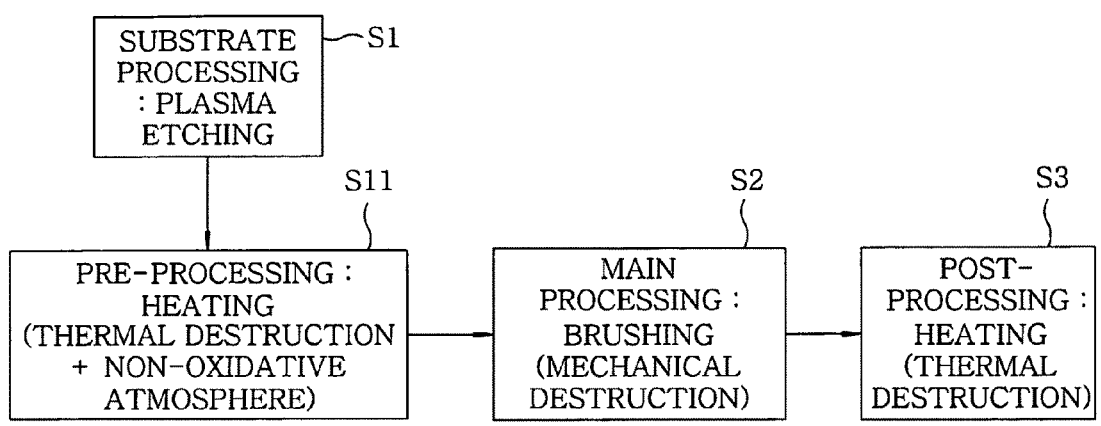
FIG. 7 is a flowchart illustrating a first example of a bevel/backside polymer removing method in accordance with a fourth embodiment of the present invention.

FIG. 7 is a flowchart illustrating a first example of a bevel/backside polymer removing method in accordance with a fourth embodiment of the present invention.

In this example, as shown in FIG. 7, pre-processing is performed prior to step S2 described above in respect of the first embodiment to thereby thermally destroy the bevel/backside polymers, e.g., the multi-layered bevel/backside polymers (step S11).

With the bevel/backside polymer removing method of this example, the multi-layered bevel/backside polymers are heated and thermally destroyed in advance prior to mechanically destroying the same. Therefore, it becomes possible to more efficiently perform the mechanical destruction in step S2.

If the heating in step S11 is performed in an oxidative atmosphere, there is a possibility that the inorganic layers in the multi-layered bevel/backside polymers may grow or stick to the wafer. For that reason, it is preferred that the pre-processing in step S11 is performed in a non-oxidative atmosphere.

The heating in step S11 may be local heating, e.g., laser light irradiation heating.

It is possible to perform the bevel/backside polymer removing method of this example by using the bevel/backside polymer removing device shown in FIGS. 5A through 5D.

The bevel/backside polymer removing method of this example may be performed as follows.

First, the peripheral edge portion of the target substrate, i.e., the wafer W in this example, is heated by the heating mechanism 4 while rotating the wafer W and while injecting no processing gas or injecting a non-oxidative gas through the processing gas injection mechanism 42. Then, the multi-layered bevel/backside polymers adhering to the peripheral edge portion of the wafer W, i.e., the backside and the bevel surface of the wafer W, are mechanically destroyed with the destroying mechanism 3 while rotating the wafer W. Thereafter, the peripheral edge portion of the wafer W is heated once again by the heating mechanism 4 while rotating the wafer W and while injecting no processing gas through the processing gas injection mechanism 42, thereby thermally destroying the multi-layered bevel/backside polymers adhering to the backside and the bevel surface of the wafer W.

In this manner, the bevel/backside polymer removing method of the first example of the fourth embodiment can be performed by using the bevel/backside polymer removing device shown in FIGS. 5A through 5D, as is the case in the first example and other examples of the bevel/backside polymer removing method of the first embodiment described above.

As with the first example, below-mentioned second and third examples of the bevel/backside polymer removing method of the fourth embodiment can be performed by using the bevel/backside polymer removing device shown in FIGS. 5A through 5D.

Second Example

Figure 8:
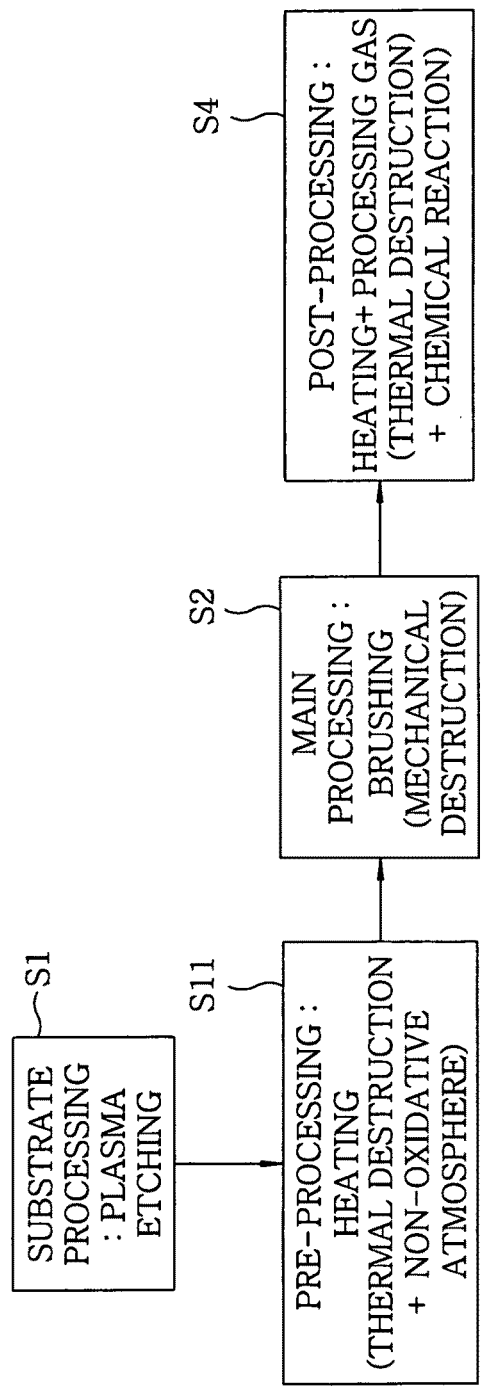
FIG. 8 is a flowchart illustrating a second example of the bevel/backside polymer removing method in accordance with the fourth embodiment of the present invention.

FIG. 8 is a flowchart illustrating a second example of the bevel/backside polymer removing method in accordance with the fourth embodiment of the present invention.

In the second example, as shown in FIG. 8, the thermal destruction of the multi-layered bevel/backside polymers in step S11 is preliminarily performed as pre-processing in another example of the first embodiment shown in FIG. 2.

In this manner, the multi-layered bevel/backside polymers may be thermally destroyed in advance prior to mechanically destroying the same in another example of the first embodiment shown in FIG. 2.

In the second example, it is preferred that the pre-processing (step S11) is performed in a non-oxidative atmosphere.

Third Example

Figure 9:
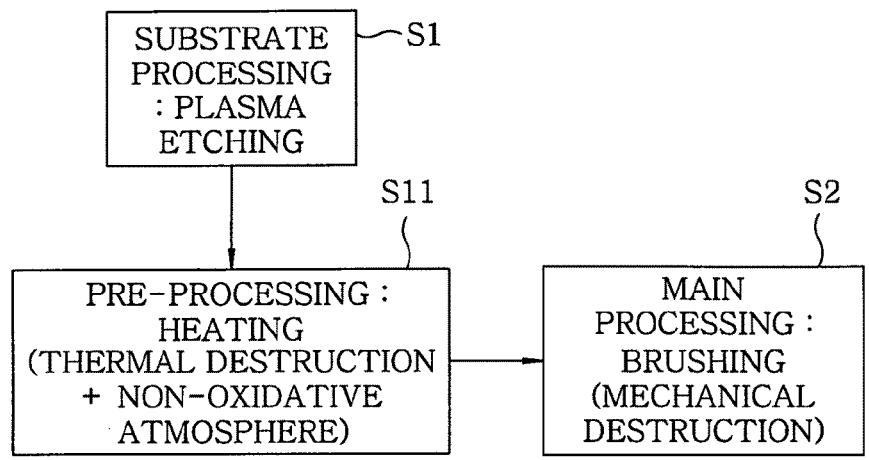
FIG. 9 is a flowchart illustrating a third example of the bevel/backside polymer removing method in accordance with the fourth embodiment of the present invention.

FIG. 9 is a flowchart illustrating a third example of the bevel/backside polymer removing method in accordance with the fourth embodiment of the present invention.

In the third example, as shown in FIG. 9, the post-processing is omitted and the multi-layered bevel/backside polymers are removed through two steps, i.e., the pre-processing (step S11) and the main processing (step S2).

By thermally destroying the multi-layered bevel/backside polymers in the pre-processing (step S11) as noted above, it is possible to efficiently remove the multi-layered bevel/backside polymers in the main processing (step S2). Therefore, the post-processing (step S3 and step S4) shown in FIGS. 7 and 8 may be omitted.

In the third example, it is preferred that the pre-processing (step S11) is performed in a non-oxidative atmosphere.

Fifth Embodiment

The fifth embodiment is directed to examples of a brushing mechanism of the destroying mechanism 3.

First Example

Figure 10A:
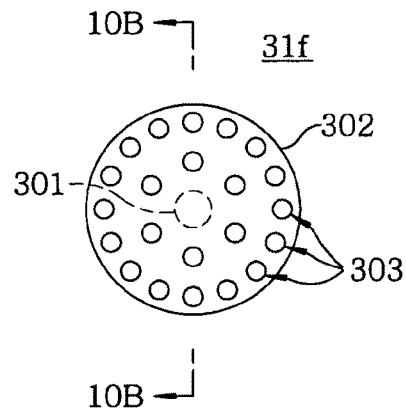
FIGS. 10A and 10B are views showing a first example of a brushing mechanism.
Figure 10B:
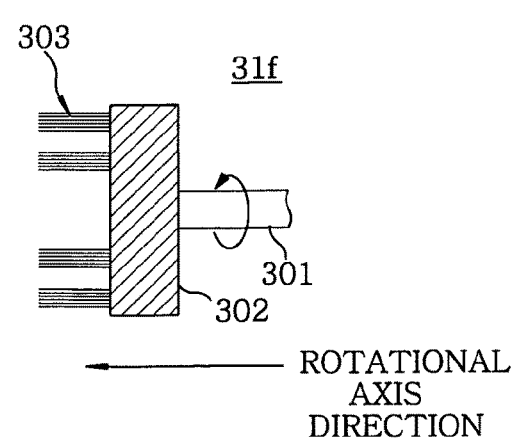

FIGS. 10A and 10B are views showing a first example of a brushing mechanism. FIG. 10A is a plan view of the brushing mechanism and FIG. 10B is a sectional view taken along line 10B-10B in FIG. 10A.

As shown in FIGS. 10A and 10B, the brushing mechanism 31f of the first example includes a rotating shaft 301 rotated by the brush rotating mechanism 31c or 31d shown in FIG. 5, a circular base 302 attached to the tip end of the rotating shaft 301 and a brush portion 303 extending from the base 302 parallel to a rotational axis direction.

The multi-layered bevel/backside polymers can be mechanically destroyed by rotating the brush portion 303 shown in FIGS. 10A and 10B.

Figure 11A:
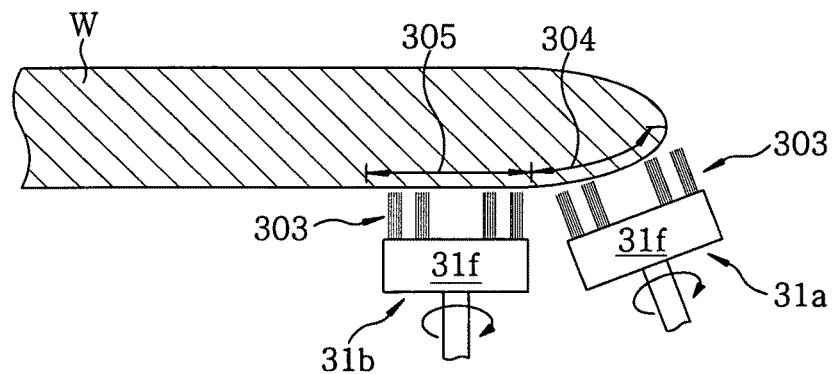
FIGS. 11A and 11B are views for explaining the operation performed by the first example of the brushing mechanism.
Figure 11B:
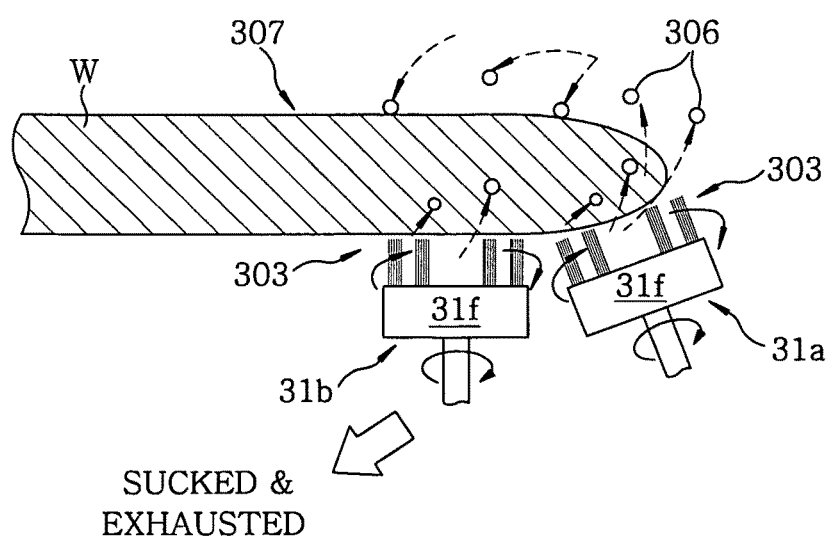

Since the brush portion 303 of the brushing mechanism 31f of the first example is parallel to the rotational axis direction, there is a possibility that, if the brush portion 303 is perpendicularly brought into contact with the bevel surface 304 or the backside 305 as shown in FIG. 11A, the multi-layered bevel/backside polymers 306 destroyed may be swept upwardly as illustrated in FIG. 11B. In such an instance, the multi-layered bevel/backside polymers 306 destroyed may possibly re-adhere to a front side 307 of the wafer W.

Figure 5C:
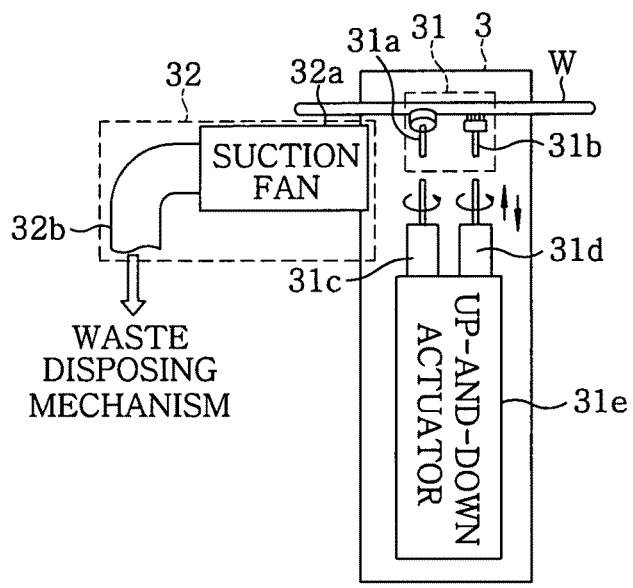
Figure 5D:
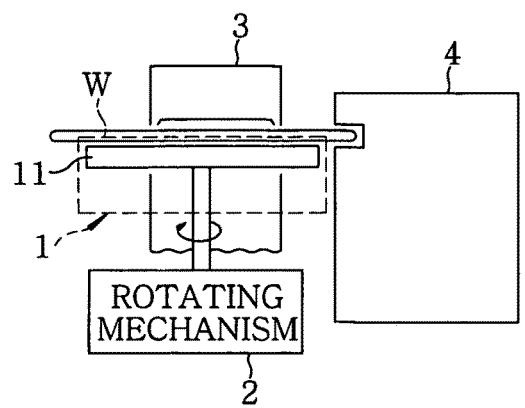

Such re-adherence of the multi-layered bevel/backside polymers 306 destroyed can be prevented by sufficiently strong sucking and exhausting them with the suction/exhaust mechanism 32 shown in FIG. 5C.

Figure 12:
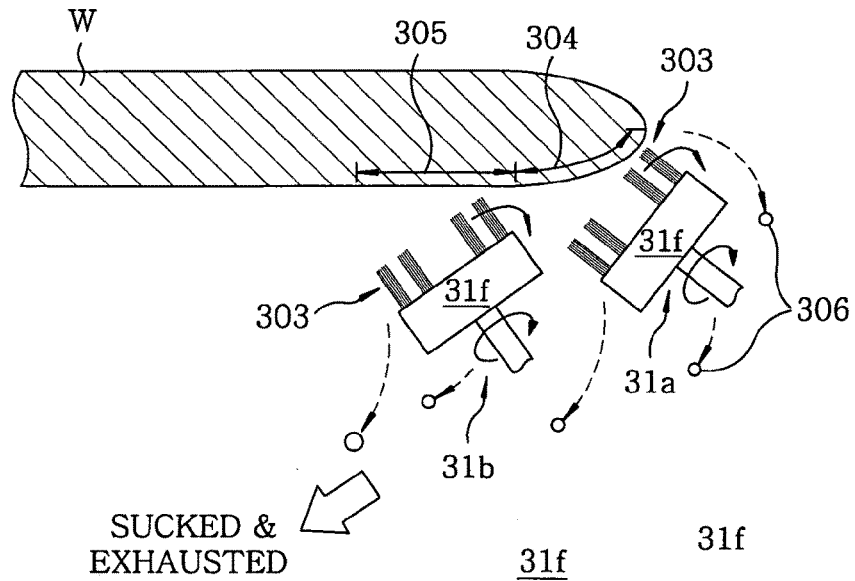
FIG. 12 is a view illustrating an instance where the first example of the brushing mechanism comes into contact with a wafer.

In order to basically prevent the upward sweeping of the multi-layered bevel/backside polymers 306 destroyed, the brush portion 303 may be obliquely, but not perpendicularly, brought into contact with the bevel surface 304 or the backside 305 as illustrated in FIG. 12 so that the brush portion 303 can downwardly sweep the multi-layered bevel/backside polymers 306 destroyed.

By bringing the brush portion 303 into contact with the bevel surface 304 and the backside 305 in an inclined state as illustrated in FIG. 12, it is possible to prevent the multi-layered bevel/backside polymers destroyed from being swept upwardly.

Second Example

Figure 13A:
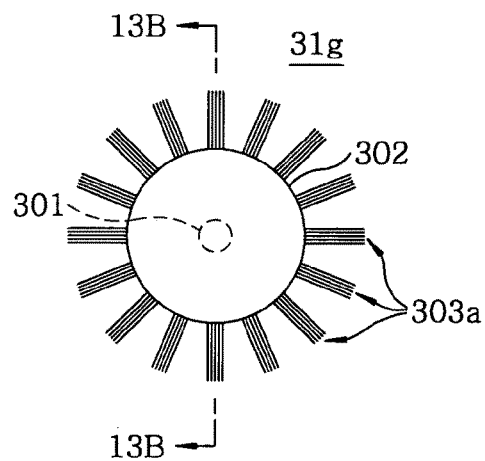
FIGS. 13A and 13B are views showing a second example of the brushing mechanism.
Figure 13B:
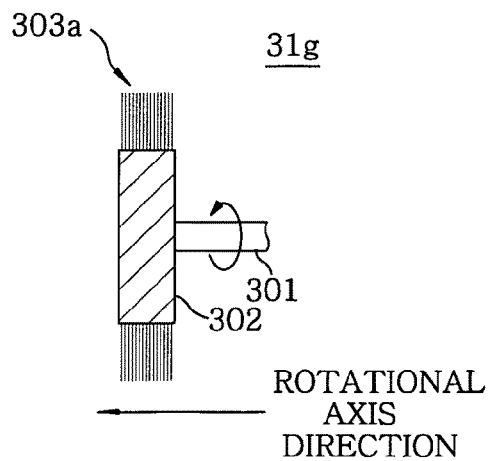
Figure 14:
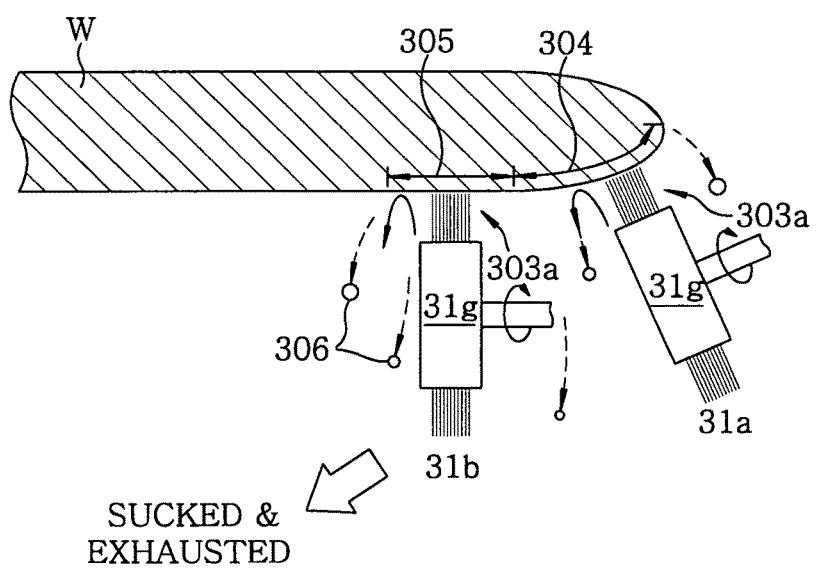
FIG. 14 is a view illustrating an instance where the second example of the brushing mechanism comes into contact with a wafer.

FIGS. 13A and 13B are views showing a second example of the brushing mechanism. FIG. 13A is a plan view of the brushing mechanism and FIG. 13B is a sectional view taken along line 13B-13B in FIG. 13A.

As can be seen in FIGS. 13A and 13B, the brushing mechanism 31g of the second example differs from the brushing mechanism 31f of the first example shown in FIGS. 10A and 10B, in that the brush portion 303a extends from the base 302 to intersect the rotational axis direction (at a right angle in this example).

With the brushing mechanism 31g of the second example, it is possible to bring the brush portion 303a into contact with the wafer W in such a direction as to downwardly sweep the multi-layered bevel/backside polymers destroyed. This makes it possible to prevent re-adherence of the multi-layered bevel/backside polymers to the wafer W, wherein the re-adherence could otherwise be caused by the upward sweeping of the multi-layered bevel/backside polymers destroyed.

While the present invention has been described above with reference to certain embodiments, the invention is not limited thereto but may be modified in many different forms.

For example, other means for mechanically destroying the multi-layered bevel/backside polymers may be used instead of the brushing mechanism.

Furthermore, other means for heating the residues of the multi-layered bevel/backside polymers may be used in place of the laser light irradiation.

While the invention has been shown and described with respect to the embodiments, it will be understood by those skilled in the art that various changes and modification may be made without departing from the scope of the invention as defined in the following claims.

What is claimed is:

1. A bevel/backside polymer removing method, comprising the sequential steps of:
   providing a target substrate having multi-layered bevel/backside polymers adhering to a bevel surface and a backside of the target substrate, the multi-layered bevel/backside polymers including an inorganic layer and an organic layer;
   heating the multi-layered bevel/backside polymers;
   mechanically breaking the heated multi-layered bevel/backside polymers; and
   heating residues of the mechanically broken multi-layered bevel/backside polymers to thermally remove the residues, wherein the residues have a thermal expansion coefficient that is different than that of the target substrate, and wherein the difference between the thermal expansion coefficient of the residues and that of the target substrate causes the residues to be removed during the heating,
   wherein the mechanical breaking step is performed on the bevel surface and on a backside region extending about 5 mm from an edge of the target substrate, and
   wherein the bevel/backside polymer removing method is a dry process.

2. The bevel/backside polymer removing method of claim 1, wherein the step of heating the multi-layered bevel/backside polymers is performed between the providing step and the mechanically breaking step in a non-oxidative atmosphere so that growing of the inorganic layer or sticking of the inorganic layer to the target substrate is restrained.

3. The method of claim 2, wherein the heating the residues comprises irradiating the residues with laser light and injecting ozone gas toward the residues.

4. The method of claim 3, wherein the mechanical breaking comprises contacting a brush at an oblique angle with a bevel or backside surface of the target substrate to generate dust of a part of the mechanically broken multi-layered bevel/backside polymers and removing the dust via a suction fan.

5. The method of claim 4, wherein the bevel/backside polymer removing method does not use charged particles to remove the bevel/backside polymers.

6. The bevel/backside polymer removing method of claim 1, wherein the multi-layered bevel/backside polymers are thermally destroyed in the heating step that is performed before the breaking step.

7. A non-transitory computer-readable storage medium storing a program for controlling, when executed by a computer, removal of bevel/backside polymers, wherein the program is adapted to, when executed, cause the computer to control a bevel/backside polymer removing device to perform the bevel/backside polymer removing method of claim 1.

* * * * *